US008875074B1

(12) United States Patent
Busch (10) Patent No.: US 8,875,074 B1
(45) Date of Patent: Oct. 28, 2014

(54) FORMAL FAULT DETECTION (71) Applicant: Infineon Technologies AG, Neubiberg (DE)

(72) Inventor: Holger Busch, Brunnthal (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/868,162

(22) Filed: Apr. 23, 2013

(51) Int. Cl.
*G06F 17/50* (2006.01)

(52) U.S. Cl.
CPC .................. *G06F 17/5081* (2013.01)
USPC ....................................................... 716/106

(58) Field of Classification Search
USPC ....................................................... 716/106
See application file for complete search history.

(56) References Cited

U.S. PATENT DOCUMENTS

| 7,735,035 | B1 * | 6/2010 | Khoo et al. | 716/106 |
| 2008/0109202 | A1 * | 5/2008 | Stergiou et al. | 703/13 |
| 2012/0311513 | A1 * | 12/2012 | Kurshan et al. | 716/106 |
| 2014/0046647 | A1 * | 2/2014 | Tsai et al. | 703/14 |

* cited by examiner

*Primary Examiner* — Suresh Memula
(74) *Attorney, Agent, or Firm* — Eschweiler & Associates, LLC (57) ABSTRACT

A method for formal fault detection in a design model includes providing a plurality of faults which are individually activatable in the design model, and providing a plurality of properties for the design model wherein each property of the plurality of properties is valid if none of the plurality of faults is activated. The method further includes selecting a property of the plurality of properties, and determining, by a formal property checker, whether activation of one fault of the plurality of faults causes the selected property to fail. If the formal property checker finds a particular fault which, when activated, causes the selected property to fail, determining that the selected property is capable to detect the particular fault, and if the formal property checker does not find any particular fault which, when activated, causes the selected property to fail, determining that the selected property is not capable to detect any fault of the plurality of faults.

25 Claims, 2 Drawing Sheets

FORMAL FAULT DETECTION

FIELD

The disclosure relates to methods and systems for formal fault detection, in particular, to methods and systems for formal fault detection in an instrumented model of design at register-transfer-level (RTL) or lower level.

BACKGROUND

Verification engineers and managers of chip design projects need tools for planning, controlling progress, and declaring sign-off of functional verification. Various coverage metrics for measuring progress and completion of functional verification of RTL design of components of systems on chips are well established for simulation-based verification.

In recent years, experience with formal property-checkers has shown that formal verification as an alternative approach is more efficient and exhaustive than simulation for a range of verification tasks. Therefore, mixed verification environments with simulation and formal verification tools are used more frequently in design projects.

However, the combination of mixed verification approaches is still unclear, as, finally, quantification and combination of all verification results is required, regardless of which verification technology has been applied to a verification task. In addition, formal property checking methodologies shall provide compatible metrics usable and interpretable by project managers without in-depth expertise in formal methods.

While completeness and coverage of formal properties have already been addressed, sufficient efficiency of formal property coverage measurement, which is crucial for any productive verification of industrial RTL designs, has not yet been gained. Thus, common formal property qualification approaches are based on very weak coverage notions, are limited to small applications, or still suffer from run-times hardly acceptable in productive chip design project schedules. This inefficiency of formal property qualification is still a major obstacle for wider acceptance and exploitation of the potentials of formal property-checking technology in industrial chip-design.

One general qualification approach for formal properties is based on injection of faults into designs and checking whether the injected faults are detected by the properties. If the detection of each fault is related to the coverage of a corresponding piece of code, the ratio of all faults detected by a set of properties to all injected faults is an appropriate measure of the overall code coverage by the set of properties, and in addition provides information of design parts not sufficiently addressed by verification.

While fault injection for the purpose of coverage analysis itself is conceptually well understood, the feasibility and efficiency of such qualification approaches in industrial chip design projects is a problem, because a potentially very large number of combinations of faults and test-cases/properties needs to be checked within the typically very tight schedule of chip development.

Therefore, there e.g. exists a need for an improved method and system for formal fault detection, in particular, for formal fault detection in an instrumented model of a register-transfer-level (RTL) design.

SUMMARY

In accordance with an aspect of the disclosure, there is provided a method for formal fault detection in a design model comprising providing a plurality of faults which are individually activatable in the design model, and providing a plurality of properties for the design model, wherein each property of the plurality of properties is valid if none of the plurality of faults is activated. The method further comprises selecting a property of the plurality of properties, and determining, by a formal property checker, whether activation of one fault of the plurality of faults causes the selected property to fail. If the formal property checker finds a particular fault which, when activated, causes the selected property to fail, the method comprises determining that the selected property is capable to detect the particular fault, and if the formal property checker does not find any particular fault which, when activated, causes the selected property to fail, the method comprises determining that the selected property is not capable to detect any fault of the plurality of faults.

In accordance with a further aspect of the disclosure, there is provided a system for formal fault detection in a design model. The system comprises a property selector configured to receive a plurality of properties for the design model and select a property of the plurality of properties, wherein each property of the plurality of properties is valid if none of a plurality of faults is activated in the design model. The system further comprises a formal property checker configured to respectively activate only one fault of the plurality of faults and determine whether activation of the respective one fault causes the selected property to fail, and an evaluation tool configured to evaluate a determination result of the formal property checker. If the formal property checker finds a particular fault which, when activated, causes the selected property to fail, the evaluation tool determines that the selected property is capable to detect the particular fault, and if the formal property checker does not find any particular fault which, when activated, causes the selected property to fail, the evaluation tool determines that the selected property is not capable to detect any fault of the plurality of faults.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and together with the description serve to explain the principles of the disclosure. Other embodiments of the present disclosure and many of the intended advantages of the present disclosure will be readily appreciated as they become better understood by reference to the following detailed description.

DETAILED DESCRIPTION

In the following detailed description, reference is made to the accompanying drawings, which form a part hereof, and in which is shown by way of illustration specific embodiments in which the disclosure may be practiced. It is to be understood that other embodiments may be utilized and structural or other changes may be made without departing from the scope of the present disclosure. The following detailed description, therefore, is not to be taken in a limiting sense, and the scope of the present disclosure is defined by the appended claims.

Embodiments of the disclosure may favorably be used together with any instrumentation of design and/or proof system with verification code, wherein each coverage item of the design or design model to be checked for coverage by formal properties is individually selectable, each check of coverage is performed by a formal property proof, and the selected item is considered to be covered by a selected property if the property no longer holds in the same way it did before when it was proven without instrumentation for the purpose of regular functional verification. If e.g. a proof checker has several proof engines with different capabilities, failure with a previously successful proof-engine may be interpreted as coverage of the item, even if another engine might still prove the property. In the following, we associate coverage of a coverage item with detection of a dedicated fault injected to cause a property to fail. Thus, if and only if the coverage item is covered, an injected dedicated fault causes the property to fail, whereas a hold result indicates that the checked property does not cover the corresponding coverage item.

The selection of coverage items or injected faults can be encoded in an activation vector, wherein each position of the activation vector corresponds to a different coverage item. Each 1-position means that the corresponding coverage item is selected, or the injected fault is enabled, whereas a 0-position means the fault is disabled, i.e. normal behavior is assumed for that piece of code. It is possible to select several coverage items in parallel, even though for a detailed analysis it is normally advantageous to not consider simultaneous activations. Such an activation vector may be contained in suitable instrumented designs, such as the fault vector generated by Certitude.

Unlike previous approaches, the proposed method does not iteratively select a single or group of coverage items to be checked individually, e.g. by a fault enable assumption/fault, before invoking the formal property checker. Instead, it causes the formal proof engine to compute a detectable fault just in the same way as in ordinary verification a counterexample is constructed if a property fails. If such a fault detectable by a specific property exists, the proof engine will detect it. Accordingly, a property to be checked for coverage is enhanced with an assumption on the activation vector. This assumption does not address a specific coverage item, but just states that an arbitrary element from a given set of items shall be activated. This can be achieved by a 1-hot predicate (or n-hot for multiple activation) of the activation vector which specifies that exactly one arbitrary item is selected, while all others are deselected.

For example, in embodiments using Certitude, 1-positions of the fault-enable vector identify selected items activating fault conditions of the RTL design which cause original assignments or branch conditions to be by-passed or replaced.

In each new round, the set of selectable coverage items is reduced by those already covered in previous iterations. After each failed proof, a counterexample is generated by the property checker, where exactly one specific position of the activation vector is 1 which corresponds to an activated coverage item and all other positions are 0, i.e. correspond to non-activated items. This 1-position is extracted from the counterexample and identifies a newly detected coverage item. If a property is proven despite the 1-hot assumption that one coverage item is selected, this particular property does not depend on any of the remaining activatable coverage items. Thus, the particular property is removed from the set of properties to be checked as it does not cover any further coverage item of the remaining coverage items, e.g. in implementations using Certitude, none of the still activatable faults causes the property to fail.

The procedure terminates when either the property set or the set of open coverage items is empty, because no further checks have any chance to cover another coverage item. If the procedure terminates with a non-empty coverage item set, the remaining coverage items directly reflect the code not covered by any member of the initial property set. A non-empty final property set will not occur, if all coverage items have already been detected and the initial property set has fully been proven on the non-instrumented design or under the assumption that no coverage item is enabled, just like in a normal regression.

This approach allows the number of coverage checks to be substantially reduced by orders of magnitude: Instead of performing a number of checks (nc) according to the product of quantity of properties (np) and quantity of coverage items (ni), nc=np*ni, in the worst case, the maximum number of checks (nc) to be performed according to the proposed procedure is just at most the sum of both numbers: nc≤np+ni: Each property check is guaranteed to either yield a newly detected coverage item or a hold-result for the current property, which is then immediately excluded from all further iterations, because it can no longer contribute any coverage.

This termination criterion guarantees that if all items are covered, just nc=ni+npx with npx≤np checks have been performed, where npx is the number of properties which were proven before all coverage items have been detected. If only niy<ni coverage items have been detected before all properties are proven, only nc=niy+np checks have been carried out after completing the last iteration i.e. when the loop is terminated.

If it is assumed, that an average of np/2 checks are performed for each coverage items in previous approaches, nc=0.5*np*ni, the invented procedure saves at least 0.5*np*ni−np−ni checks.

With realistic numbers, np=200, ni=5000, tc=500 secs (average check time), the following total coverage computation times result: 0.5*200*5000*500 secs=250 million secs=2900 days=8 years for the conventional vs. 5200*500 secs=2.6 million secs=38 days for the proposed approach.

In both simple calculations, reduction by parallelization, e.g. running 20 checks in parallel (according to the pool of available property-checking licences), partitioning of designs and corresponding property sets, or other strategies for avoiding checks as, for example, supported by Certitude, are here not yet taken into account for the time being, as they can be combined with the proposed approach.

As qualification of formal properties is performed incrementally, an overall qualification time of ≤3 days is acceptable in a real project schedule. Notably, the invented procedure already yields reasonable run-times with just parallelization but without further measures, which would require significant extra user effort.

As already illustrated above, a basic problem of the qualification of formal properties when using test tools, such as Certitude, Onespin's Quantify feature, etc., is the huge number of combinations of {property, coverage item}—pairs to be checked in order to yield coverage figures for a full design under verification. A high percentage of these numerous checks do not contribute any coverage. On the contrary, the proposed method inherently avoids checks of all combinations which do not contribute coverage. In fact, at most one check not contributing coverage is run for each property. This is achieved by exploiting the specific capabilities of a formal property checker.

Modern property-checkers include proof engines (e.g. satisfiability (SAT)-provers) optimized towards computing satisfying traces very efficiently. For regular property checking, when trying to prove that a property holds, the proof problem is negated in such a way that the prover searches for satisfying signal traces which set up scenarios in which the assumption and the negated commitment of the formal property hold.

For coverage analysis, a specific injected fault is activated by a corresponding extra assumption. In simulation, the test-case is run and the result analyzed for failure or pass. Failure of the test-case means the test-case has detected the activated fault. Completely analogously, failure of a property means the property has detected the fault. The property checker in this case computes a trace in which the fault is active and the regular assumption holds, and in which the commitment does not hold. The activated fault has been detected, if the property previously held without any fault being enabled. Activating each fault individually and checking, whether at least one property fails, is computationally very expensive, as an average of 50% of the properties will have to be checked for each fault until the first property fails, if there is at all such a property for each fault. If however a fault is not covered by any property, even all properties will have to be checked with that fault. Therefore the average number of checks until the qualification of a fault, i.e. detected or non-detected, has been achieved may be even higher than half of the number of properties.

According to embodiments of the disclosure, the extra fault assumption does no longer enable a specific fault, but an arbitrary single fault in the instrumented design:

$$\exists i. \text{fault}(i)=1 \wedge \forall j \neq i. \text{fault}(j)=0$$

If the property with this 1-hot-assumption on the fault enable vector fails $$\exists i. \text{fault}(i)=1 \wedge \forall j \neq i. \text{fault}(j)=0 \wedge \text{ass}(P)|\text{-com}(P)$$

with ass(P) denoting the regular assumption of the property P and com(P) the regular commitment, the property checker constructs an own counterexample with a specific position i where $$\text{fault}(i)=1.$$

As the property checker includes very powerful internal algorithms that exploit internal dependencies, it will be able to find a fault very efficiently which modifies the original proof result of the property from hold to fail.

By evaluating the counterexample, the precise position of the detected fault is determined and added to the set of detected faults. Thus the set of detected faults is iteratively augmented. The order in which the faults will be detected is not forecastable without analyzing the internal strategies of the proof engines. In the second iteration, the already detected fault position, say $i_0$, is excluded in an augmented assumption, in order to avoid that the property checker detects the same fault again and again:

$$\exists i_1. i_1 \neq i_0 \wedge \text{fault}(i_1)=1 \wedge \forall j \neq i_1. \text{fault}(j)=0.$$

Generally in iteration n all previously detected faults are excluded:

$$\exists i_{n+1}. i_{n+1} \neq i_0 \wedge i\, i_{n+1} \neq i_1 \wedge \ldots \wedge i_{n+1} \neq i_n \wedge \text{fault}(i_{n+1})=1 \wedge \forall j \neq i_{n+1}. \text{fault}(j)=0$$

For each property, in each iteration either a new fault is found, or the property finally holds if all previously detected faults are suppressed in the fault assumption.

If Property $P_k$ holds after a set $I_m$ of fault positions have been detected in m iterations, Property $P_k$ is no longer checked in further iterations, because there is no chance to detect any further fault position by $P_k$. Thus in each iteration the fault assumption is strengthened with respect to the previous iteration. By a general formal logic inference rule $$A_1|\text{-}C \text{ implies } A_1 \wedge A_2|\text{-}C$$

it can be inferred that, in each further iteration with an even stronger fault assumption, the property commitment must hold as well.

Another possible result of a check can be vacuity, caused by a contradiction between the regular property assumption ass(P) and the current fault-enable assumption:

$$\forall i_{n+1}. i_{n+1} \neq i_0 \wedge i\, i_{n+i} \neq i_1 \wedge \ldots \wedge i_{n+1} \neq i_n \wedge \text{fault}(i_{n+1})=1 \wedge \forall j \neq i_{n+1}. \text{fault}(j)=0|\text{-}^\vdash \text{ass}(P)$$

The occurrence of vacuity can be avoided by weakening the assumption made before ($\exists i_{n+1}. i_{n+1} \neq i_0 \wedge i\, i_{n+1} \neq i_1 \wedge \ldots \wedge i_{n+1} \neq i_n \wedge \text{fault}(i_{n+1})=1 \wedge \forall j \neq i_{n+1}. \text{fault}(j)=0$) by removing the "fault($i_{n+1}$)=1"-condition from the "∃-expression":

$$\exists i_{n+1}. i_{n+1} \neq i_0 \wedge i\, i_{n+1} \neq i_1 \wedge \ldots \wedge i_{n+1} \neq i_n \wedge$$
$$\forall j \neq i_{n+1}. \text{fault}(j)=0$$

As the property was proven for fault(i)=0 for all i beforehand, the property checker will by itself set a fault in the arbitrary position i to 1, if this will make the property fail. The difference to the previous version is that vacuous assumptions are avoided.

In this case, the property P is not able to generate any counterexample with any of the remaining faults enabled. Depending on the order in which the properties are selected, vacuity need not occur, if all the remaining faults happen to have been detected by other properties which fail. If the weakened assumption without "fault($i_{n+1}$)=1" is used, no vacuity will occur at all in any iteration.

A simple example of a combinational circuit with 2 assignments illustrates the iterative qualification procedure:
cond <=inp0;
out <=inp1 when cond else inp2;
3 properties are available, which evidently fully describe the input-output behavior of the circuit:
P0: inp0|-out=inp1 and
P1: ⌐ cond |-out=inp2
P2: |-cond=inp0
2 faults are injected:
cond <=1 when fault(0) else inp0;
out <=inp1 when cond else inp1 when fault(1) else inp2;
The following property check results are achieved, if each combination is checked:

| fault(0) | fault(1) | P0 | P1 | P2 |
|---|---|---|---|---|
| 0 | 0 | hold | hold | hold |
| 1 | 0 | hold | vac | fail |
| 0 | 1 | hold | fail | hold |
| 1 | 1 | hold | vac | hold |

The iterative procedure starts with the fault set F={fault(0), fault(1)} to be qualified and the set of qualification properties QP:={P0,P1,P2}. Each time, a 1-hot assumption is added that exactly 1 arbitrary member of the current set F is enabled.

The iterations yield the following results, if properties are selected in the order P0,P1,P2 (printed in bold letters):
QP:={P0,P1,P2}, F={fault(0),fault(1)}~>hold: remove P0 from QP
QP:={P1,P2}, F:={fault(0),fault(1)}~>fail(fault(1)): remove fault(1) from F
QP:={P1,P2}, F:={fault(0)}~>hold: remove P1 from QP QP:={P2}, F:={fault1}~>fail(fault(0)): remove fault(0) from F
QP:={P2}, F:={ }~>terminated after 4 checks
If the properties are selected in the order P1, P2, P0, the iterations yield the following results:
QP:={P0,P1,P2}, F:={fault(0),fault(1)}~>fail(fault(1): remove fault(1) from F
QP:={P0,P1,P2}, F:={fault(0)}~>vac (*): remove P1 from QP
QP:={P0,P2}, F:={fault(0)}~>fail(fault(0)): remove fault(0) from F
QP:={P0,P2}, F:={ }~>terminated after 3 checks
(*) removing Property P1 from QP after vacuous result makes sense, as P1 is not related to the remaining fault(0).
If the order of properties is not fixed and the selection of properties optimal, even less iterations are needed:
QP:={P0,P1,P2}, F:={fault(0),fault(1)}~>fail(fault(1)): remove fault(1) from F
QP:={P0,P1,P2}, F:={fault(0)}~>fail(fault(0)): remove fault (0) from F
QP:={P0,P1,P2}, F:={fault(0)}~>terminated after 2 checks
This simple example also illustrates that the selection of properties influences the number of iterations needed for full qualification.
Generally, the following boundaries for the number of iterations or checks can be given:
number of faults ≤number of iterations ≤
≤number of properties+number of faults−1

Figure 1:
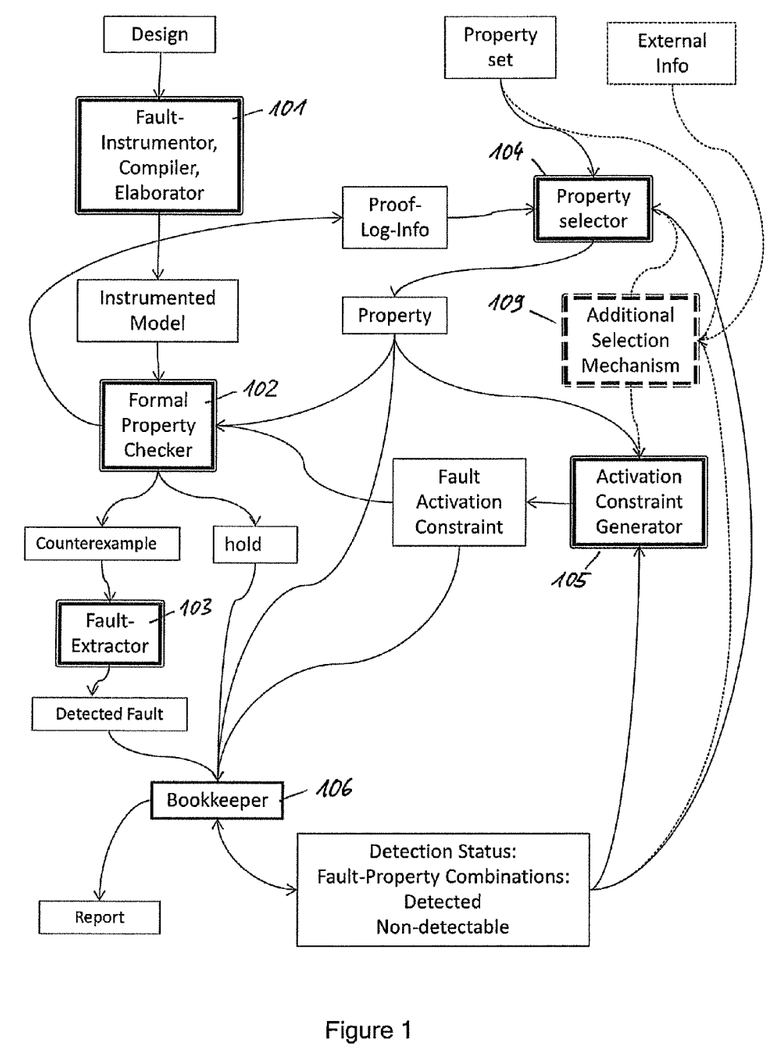
FIG. 1 shows a simplified schematic diagram of an example system according to an embodiment of the disclosure.

FIG. 1 shows a simplified schematic diagram of an example system according to an embodiment of the disclosure.

The system depicted in FIG. 1 comprises a software tool 101, a formal property checker 102, a fault extractor 103, a property selector 104, an activation constraint generator 105, an updating means 106 which may also be referred to as "bookkeeper" and an optional additional selection mechanism 109.

The software tool 101 may include a translator/compiler which translates the RTL (register-transfer-level) design-under-verification given in a design/hardware description language, such as VHDL or Verilog, into an instrumented model understood by the formal property checker. The instrumented model generated by the compiler 101 allows injected faults to be selectively activated. For this, tool 101 may further include means for injecting faults, also referred to as "fault-instrumentor" which injects or activates faults in the instrumented model. In one embodiment, Certitude, a commercially available product, may be used as tool 101.

The formal property checker 102 proves (checks) properties selected and provided by the property selector 104. The formal property checker 102 outputs a "hold" or "fail" result for each property. When obtaining a fail result, the formal property checker 102 generates at least one counterexample and, in embodiments of the disclosure, additionally a signal trace and proof log information, such as run-time memory consumption and used proof strategies which may later advantageously be used for property selection, e.g. prioritization of "fast" properties. When obtaining a "hold" result, none of the faults allowed by the fault activation constraint output by the activation constraint generator 105 causes the property selected by the property selector 104 to fail. It is to be appreciated that any commercial or non-commercial formal property checker capable of proving formal properties or generating counterexample(s) if a property cannot be proven may also be utilized as formal property checker 102.

The fault extractor 103 analyzes the counterexamples provided by the formal property checker 102 and extracts the activated faults from the counterexample. The extracted faults are the faults which can be detected by the checked property.

The bookkeeper or updating means 106 receives information about proof results in each iteration: Which property has detected which fault for a "fail" result and which property has been proven for a "hold" result. Based on the received information, the bookkeeper 106 updates the detection status which comprises the following information: Which fault was detected by which property and, for each property, which faults can no longer be detected by that property. The bookkeeper 106 may also generate a report including, for example, the detection status at any time during iterations. The detection status is used as input for the property selector 104 and the activation constraint generator 105. Initially, the detection status indicates that any property can potentially detect any fault.

The activation constraint generator 105 receives the detection status and generates the fault activation constraint indicating the set of faults from which the formal property checker 102 can choose when activating individual faults to prove selected properties.

Based on the detection status output by the updating means 106, the property selector 104 selects properties which can still detect faults. This selection may additionally be optimized by a proof log info about previous proofs, for example, output by the formal property checker 102 in each iteration.

In some embodiments, the system may also comprise an optional additional selection mechanism 109 which receives user information or additional information generated by a further tool and indicates which fault subsets are most conveniently detectable by which properties.

The system depicted in FIG. 1 carries out an iterative procedure: In each iteration, a property is selected and checked based on the fault activation constraint, the result is evaluated, and faults detected and/or a property proven in the current iteration are excluded for subsequent iterations. The procedure terminates when all faults are detected or no property is left which could detect the remaining, i.e. not yet detected, faults.

Figure 2:
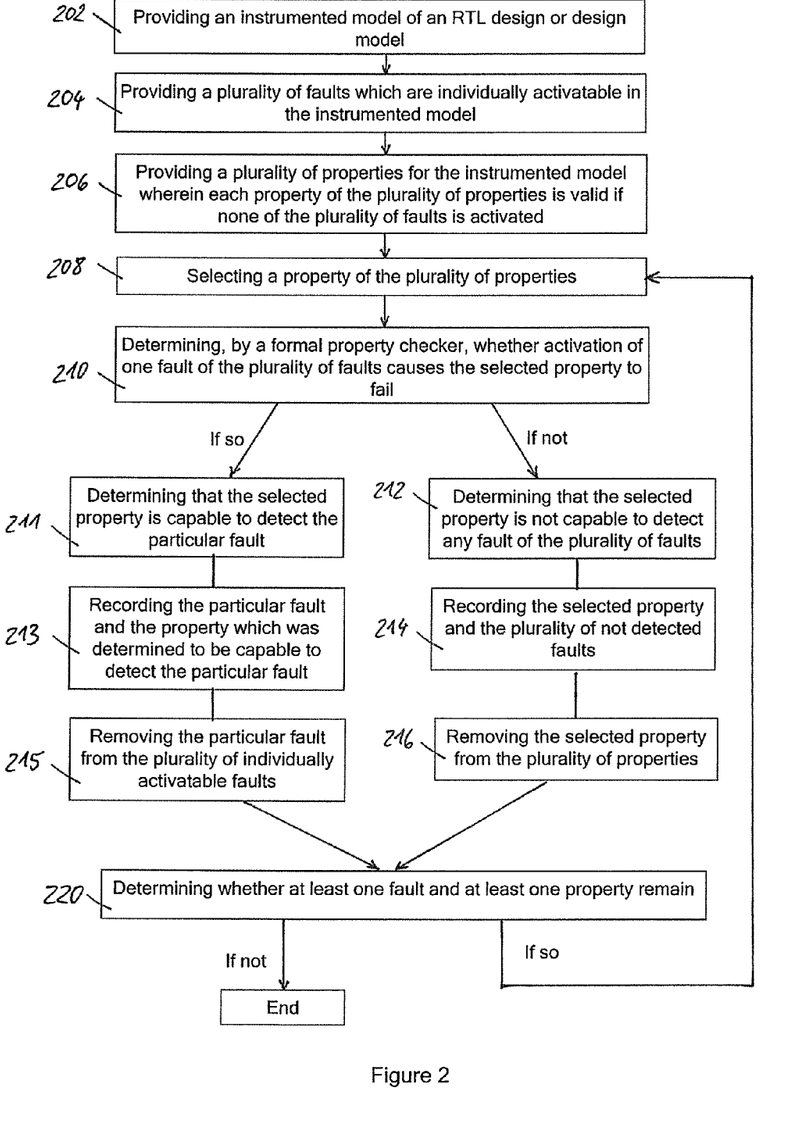
FIG. 2 shows an example method according to an embodiment of the disclosure.

FIG. 2 shows an example method according to an embodiment of the disclosure, in particular, a method for formal fault detection in an instrumented model of an RTL design. The example method comprises: providing an instrumented model of an RTL design or design model at 202, providing a plurality of faults which are individually activatable in the instrumented model at 204, and providing a plurality of properties for the instrumented model wherein each property of the plurality of properties is valid if none of the plurality of faults is activated at 206. The method further comprises selecting a property of the plurality of properties at 208, and determining, by a formal property checker, whether activation of one fault of the plurality of faults causes the selected property to fail at 210, and if so, the method proceeds to 211 and if not, the method proceeds to 212.

If the formal property checker finds a particular fault which, when activated, causes the selected property to fail, the method proceeds with determining that the selected property is capable to detect the particular fault at 211, recording the particular fault and the property which was determined to be capable to detect the particular fault at 213 and removing the particular fault from the plurality of individually activatable faults at 215.

If the formal property checker does not find any particular fault which, when activated, causes the selected property to fail, the method proceeds with determining that the selected property is not capable to detect any fault of the plurality of faults at 212, recording the selected property and the plurality of not detected faults at 214, and removing the selected property from the plurality of properties at 216.

Then, if at least one fault and at least one property remain after removing the detected fault at 215 or the selected property at 216, the method proceeds to 208 and, otherwise, the method terminates.

It is, however, to be appreciated that the order of acts depicted in FIG. 2 and described above is only one example sequence and many other sequences of acts are also possible.

According to a further embodiment of the disclosure, a basic procedure receives a set of index positions corresponding to faults to be detected, and a set of properties as input. As output, the procedure returns a list of detected faults and for each fault a corresponding property which detected the fault. In addition, another list is output with properties and for each property a list of faults which were still undetected when the property was proven. The procedure is incremental and reads previous results. Therefore, the procedure can be interrupted and restarted at any time.

Initially, a sanity check may be performed: With all faults being deselected, all properties are checked, similarly to a normal regression. Properties which fail during this fault-free regression are excluded.

Then a loop is entered and not left until there are no qualification properties or no undetected faults left.

At the beginning of the loop, properties which due to previous checks are known to be unable to detect any further faults are excluded from the remaining set of qualification properties.

Based on the current set of remaining faults, an assumption is generated which allows an arbitrary single fault of this set to be selected. This fault-enabling assumption is added to all properties being checked in the current iteration and is strengthened in each further iteration.

Depending on the number of possible parallel checks, one or several properties are selected for the next round of property checks. Parallelization strategies will be addressed below.

After the check phase of the current iteration, the activated faults are collected from counterexamples and added to the previously detected ones. Proven properties are added to the set of properties which are no longer capable to yield further coverage, all others are kept in the set of active properties to be checked for fault detection in further iterations.

If there are still active properties and undetected faults left, the loop is continued, otherwise terminated.

This basic procedure allows several optimizations. The selection of properties to be checked may be optimized according to previous run-times: "fast" properties, i.e. properties with short previous run-times, are prioritized. As some coverage items may be covered by several properties, it is in total more efficient to run the fast properties first.

For each property, the specific proof engine which achieves the proof during the sanity check may advantageously be recorded. In the iterative coverage detection phase, each property may only be fed into its specific proof engine. This can save a lot of proof time especially for properties which were proven by simple proof engines, because, in most cases, computationally more expensive provers are not invoked.

As the coverage detection procedure can be invoked with any coverage item set, it can either run stand-alone, e.g. for the complete set of coverage items, or by another tool or routine which iteratively selects sets of coverage items to be analyzed.

In the following, some embodiments of the disclosure will be described which utilize Certitude, a commercially available product, as tool for generating an instrumented register-transfer-level (RTL) design. It is however to be appreciated that also any other tool suitable for generating an instrumented RTL design may be used.

In an embodiment with stand-alone property-checking, a tool such as Certitude may generate the instrumented RTL design, and be invoked during qualification from time to time to visualize the results yielded so far and generate metrics. A "fake" property checker is called by Certitude which just extracts results independently generated by the iterative fault detection procedure. A symbolic property sent by Certitude together with the fault is just a placeholder but not used in this embodiment with loose coupling between Certitude and the property checker.

In another embodiment with stronger coupling between Certitude and the property checker, a procedure has been devised which accepts suggestions from Certitude. Herein, Certitude selects pairs of faults and symbolic properties to be checked, which are mapped to sets of real properties. These pairs are submitted to the formal property checking environment which executes the coverage detection procedure, prioritizing properties related to the symbolic property selected by Certitude. The mapping between symbolic and real properties is refined with progressing qualification in such a way that the dependencies between adjacent faults known by Certitude's internal procedures, are exploited for faster overall detection. These strategies serve for reducing the overall qualification time, by influencing the order of checks, so that fast checks yield as much coverage as possible before slower checks are invoked.

In such embodiments with closer coupling with Certitude, the flexibility of the formal qualification procedure is needed to adjust the initial set of faults to be checked to any subset of all injected faults. Thus, it is possible to use Certitude's strategies to select faults spread over the complete design. Certitude is then instructed not only to generate one single checking task, but also to generate each time jobs for several 100 checks which are jointly passed to the formal coverage detection procedure.

In all embodiments with hand-shake between Certitude and fault detection procedure, the communication flow can be optimized. The normal Certitude procedure invokes a simulator or a property checker when new checking jobs are generated by Certitude. In order to avoid the significant overhead for repeated invocation of the property checking environment, Certitude just writes the orders to a file which is polled by a routine from the property checking environment which stays active all the time. When a new order is detected by the polling routine, the coverage detection procedure is invoked with the given new set of coverage items to be checked. As the routine has access to the full set of already detected coverage items, it avoids repeated checks. Another polling routine running in the Certitude shell waits until the checking orders have been executed. Execution of checking orders actually means that not every coverage item is physically checked when Certitude has issued the order, but is possibly just looked up in the list of results contributed by any detection procedure, without Certitude noticing that the property checker is not directly invoked. While Certitude evaluates the results of the previous checks and computes new orders by its own sophisticated heuristics, the independent coverage detection procedure of the property checker is kept busy by running checks on the complete set of remaining still undetected coverage items. It is always possible to run the general detection procedure in the property checking environment without Certitude being active and to start Certitude later. In a similar way Certitude can be instructed to generate suites of checking orders which are not executed immediately but just collected and then jointly passed to the property checking routines. This flexible handling is enabled by a specific routine, called above "fake property checker", as it just mimics the execution of orders to Certitude. Certitude immediately generates the next orders when it thinks the previous have been executed. Apart from better balancing available tool licenses of Certitude and property checker, the benefits of both tools are combined in a very efficient way: Certitude comprises heuristics to exploit dependencies between faults. For instance, if a specific fault has not been detected, another fault is dropped which has no chance to be detected either.

One especially advantageous application of this coupling is using Certitude's feature called metric computation which applies statistical methods to assess the percentage of detectable faults by a much smaller sample than the total number of coverage items. Normally, Certitude selects sets of samples for metric computation iteratively: if one set of faults has been checked, the next set of faults is selected by Certitude based on the previous results, until a sufficient level of reliability has been reached. By pretending to Certitude that all faults of the previous selection have been detected, the next set is generated, and so on, while in reality none of these checks needs to have been performed yet. In this way, a joint set of samples can be generated beforehand by Certitude and then transferred to the formal fault detection environment. If it turns out that not all faults are actually detected by the iterative qualification procedure in the property checker, the metrics computation of Certitude is restarted, this time using the real detection results for all faults qualified in the previous round. Certitude will generate a subset of the previous samples, the results of which are just looked up, and some new samples which are then treated like those in the round before, i.e., Certitude is made thinking they are detected, is by this stimulated to generate further samples, and so on. Thus the metrics and sample computation of Certitude, which takes much less time than the actual checks, is restarted several times, while no individual fault contained in any of the combined samples is checked twice by the provers due to the logging of all check results. The overhead for restarting Certitude is comparably small, as actual property checks take significantly longer. Similar hand-shake routines between Certitude and the formal detection environment can be installed for any other usage of Certitude.

Parallelization can reduce the overall qualification time by allowing several faults to be detected in each round. Parallelization is tool-dependent, which determines the exact parallelization strategy. For example, in a Onespin property-checking session, a number of properties to be submitted to the provers is selected beforehand, then distributed to a configurable number of provers. No further submission of properties may be carried out until the last of the previously submitted checks has terminated. In this example, it is not possible within a single property-checking session to submit a check of one property, extract the detected fault, and re-submit a check of the same property with strengthened fault assumption, before the other checks which were simultaneously submitted have finished. This is possible, though, by running several property-checking sessions in parallel. Parallelization in one property-checking session does not always increase the fault-detection rate. If a fast property is run in parallel with a ten times slower property, a second check with the fast property can only be submitted when the slow property has finished. Therefore it is faster in total, if the check of the slow property is postponed, and the submission cycle of the fast property is repeated 10 times, each time detecting a new fault. A corresponding procedure takes care of such optimizations. The parallelization procedure includes a component which dynamically checks how many tool licenses are currently available, in order to avoid that submitted qualification checks have to wait for licenses. This is important if several users of property checkers potentially compete for a limited pool of licenses. Another procedure aborts checks which run significantly longer than predicted and than other checks submitted in parallel and already finished. The runtimes of such aborted checks are updated and penalties added, which results in lower priorities in the selection phase of the next iteration.

If an explicit vector for fault enabling or coverage item selection is not directly given, it is also possible to provide it in extra verification code and relate it to selection/de-selection of coverage items given in different formats, by way of specific assumptions. This technique may be referred to as "vectorization". If e.g. 2 coverage conditions are to be checked the following macro may be defined:

m:={cover_cond0, cover_cond1} as a concatenated vector used in the same way in qualification checks as a fault-enable vector, where the extra cover assumption 1hot(m) causes the cover property $$1\text{hot}(m) \wedge \text{ass}(P) | -\text{com}(P)$$

to fail.

Other embodiments not related to RTL designs are also possible in all areas where fault injection and fault simulation/formal verification can be applied, e.g. fault verification of synthesis netlists or software components, if the property checker environment is able to generate an internal formal model on which properties can be checked.

A corresponding formal property set is available and provable by a property checker which is able to generate counterexamples in case of proof failure.

A fault injection and activation mechanism is available.

Individual fault activation assumptions can be added to the properties being checked.

Thus, the application spectrum of embodiments of the present disclosure is not limited to qualification of property sets for asserting the quality of functional verification, but also includes other applications in which faults are injected and tests are performed to determine whether faults are detected by properties.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method for formal fault detection in a design model comprising:
   providing a plurality of faults which are individually activatable in the design model;
   providing a plurality of properties for the design model wherein each property of the plurality of properties is valid if none of the plurality of faults is activated;
   selecting a property of the plurality of properties;
   determining, by a formal property checker, whether activation of one fault of the plurality of faults causes the selected property to fail, and
   if the formal property checker finds a particular fault which, when activated, causes the selected property to fail, determining that the selected property is capable to detect the particular fault, and if the formal property checker does not find any particular fault which, when activated, causes the selected property to fail, determining that the selected property is not capable to detect any fault of the plurality of faults.

2. The method of claim 1, further comprising:

if it is determined that the selected property is capable to detect the particular fault, recording the particular fault and the property which was determined to be capable to detect the particular fault; and if it is determined that the selected property is not capable to detect any fault of the plurality of faults, recording the selected property and the plurality of not detected faults.

3. The method of claim 1, further comprising:

if it is determined that the selected property is capable to detect the particular fault, removing the particular fault from the plurality of individually activatable faults; and if it is determined that the selected property is not capable to detect any fault of the plurality of faults, removing the selected property from the plurality of properties.

4. The method of claim 3, further comprising:

selecting a further property of the remaining properties of the plurality of properties;

determining, by the formal property checker, whether activation of one fault of the remaining faults of the plurality of individually activatable faults causes the selected property to fail; and if the formal property checker finds a further particular fault which, when activated, causes the selected further property to fail, determining that the selected further property is capable to detect the further particular fault and removing the further particular fault from the remaining faults; and if the formal property checker does not find a further particular fault which, when activated, causes the further selected property to fail, determining that the further selected property is not capable to detect any fault of the remaining faults and removing the further selected property from the remaining properties; and repeating steps (a) to (e) if at least one fault and at least one property remain.

5. The method of claim 4, further comprising:

recording the detected faults and, for each of the detected faults, the property which was determined to be capable to detect the respective fault; and recording the properties which were determined to be not capable to detect any of the remaining faults and, for each of these properties, the respective remaining undetected faults.

6. The method of claim 1, wherein the formal property checker uses an activation vector for determining whether activation of one particular fault of the plurality of faults causes the selected property to fail, wherein each component of the activation vector corresponds to one fault of the plurality of faults and one component of the activation vector has a value of 1 indicating an activated fault and all other components have zero values indicating deactivated faults.

7. Method for qualifying formal properties in a design model, the method comprising:

providing a plurality of coverage items for the design model which are individually selectable;

providing a plurality of properties for the design model wherein each property of the plurality of properties holds if none of the plurality of coverage items is selected;

selecting a property of the plurality of properties;

determining, by a formal property checker, whether selection of one coverage item of the plurality of coverage items causes the selected property to fail, and if the formal property checker finds a particular coverage item which, when selected, causes the selected property to fail, determining that the selected property covers the particular coverage item, and if the formal property checker does not find any particular coverage item which, when selected, causes the selected property to fail, determining that the selected property does not cover any coverage item of the plurality of coverage items.

8. The method of claim 7, further comprising:

if it is determined that the selected property covers the particular coverage item, recording the particular coverage item and the property which was determined to cover the particular coverage item; and if it is determined that the selected property does not cover any coverage item of the plurality of coverage items, recording the selected property and the plurality of not covered coverage items.

9. The method of claim 7, further comprising:

if it is determined that the selected property covers the particular coverage item, removing the particular coverage item from the plurality of individually selectable coverage items; and if it is determined that the selected property does not cover any coverage item of the plurality of coverage items, removing the selected property from the plurality of properties.

10. The method of claim 9, further comprising:

selecting a further property of the remaining properties of the plurality of properties;

determining, by the formal property checker, whether selection of one coverage item of the remaining coverage items of the plurality of individually selectable coverage items causes the selected property to fail; and if the formal property checker finds a further particular coverage item which, when selected, causes the selected further property to fail, determining that the selected further property is capable to cover the further particular coverage item and removing the further particular coverage item from the remaining coverage items; and if the formal property checker does not find a further particular coverage item which, when selected, causes the further selected property to fail, determining that the further selected property is not capable to cover any coverage item of the remaining coverage items and removing the selected property from the remaining properties; and repeating steps (a) to (e) if at least one coverage item and at least one property remain.

11. The method of claim 10, further comprising:

recording the covered coverage items and, for each of the covered coverage items, the property which was determined to cover the respective coverage item; and recording the properties which were determined to not cover any of the remaining coverage items and, for each of these properties, the respective remaining not covered coverage items.

12. The method of claim 7, wherein the formal property checker uses an activation vector for determining whether selection of one particular coverage item of the plurality of coverage items causes the selected property to fail, wherein each component of the activation vector corresponds to one coverage item of the plurality of coverage items and one component of the activation vector has a value of 1 indicating a selected coverage item and all other components have zero values indicating unselected coverage items.

13. A system of instructions for formal fault detection in a design model stored on a non-transitory storage medium, the system on instructions comprising:
   a property selector configured to receive a plurality of properties for the design model and select a property of the plurality of properties, wherein each property of the plurality of properties is valid if none of a plurality of faults is activated in the design model;
   a formal property checker configured to respectively activate only one fault of the plurality of faults and determine whether activation of the respective one fault causes the selected property to fail; and
   an evaluation tool configured to evaluate a determination result of the formal property checker, wherein,
   if the formal property checker finds a particular fault which, when activated, causes the selected property to fail, the evaluation tool determines that the selected property is capable to detect the particular fault, and
   if the formal property checker does not find any particular fault which, when activated, causes the selected property to fail, the evaluation tool determines that the selected property is not capable to detect any fault of the plurality of faults.

14. The system of claim 13, wherein:
   if the evaluation tool determines that the selected property is capable to detect the particular fault,
   the evaluation tool outputs the particular fault and the property which was determined to be capable to detect the particular fault; and
   if the evaluation tool determines that the selected property is not capable to detect any fault of the plurality of faults, the evaluation tool outputs the selected property and the plurality of not detected faults.

15. The system of claim 13, wherein:
   if the evaluation tool determines that the selected property is capable to detect the particular fault,
   the evaluation tool causes the particular fault to be removed from the plurality of faults; and
   if the evaluation tool determines that the selected property is not capable to detect any fault of the plurality of faults, the evaluation tool causes the selected property to be removed from the plurality of properties.

16. The system of claim 15, wherein:
   the property selector is further configured to select a further property of the remaining properties of the plurality of properties;
   the formal property checker is further configured to determine, whether activation of one fault of the remaining faults of the plurality of individually activatable faults causes the selected property to fail; and
   if the formal property checker finds a further particular fault which, when activated, causes the selected further property to fail, the evaluation circuit determines that the selected further property is capable to detect the further particular fault and causes the further particular fault to be removed from the remaining faults; and
   if the formal property checker does not find one further particular fault which, when activated, causes the further selected property to fail, the evaluation circuit determines that the further selected property is not capable to detect any fault of the remaining faults and causes the further selected property to be removed from the remaining properties.

17. The system of claim 13, wherein the formal property checker uses an activation vector for determining whether activation of one particular fault of the plurality of faults causes the selected property to fail, wherein each component of the activation vector corresponds to one fault of the plurality of faults and one component of the activation vector has a value of 1 indicating an activated fault and all other components have zero values indicating deactivated faults.

18. The system of claim 13, wherein the formal property checker is further configured to output at least a run-time information about a completed property check to the property selector for the purpose of prioritization of properties in subsequent checks.

19. The system of claim 13, wherein the property selector prioritizes properties whose previous checks took less time than previous checks of other properties of the plurality of properties when selecting the property of the plurality of properties.

20. A system of instructions for qualifying formal properties in a design model stored on a non-transitory storage medium, comprising:
   a property selector configured to receive a plurality of properties for the design model and select a property of the plurality of properties, wherein each property of the plurality of properties holds if none of a plurality of coverage items is selected;
   a formal property checker configured to respectively select only one coverage item of the plurality of coverage items and determine, whether selection of the respective one coverage item causes the selected property to fail; and
   an evaluation tool configured to evaluate a determination result of the formal property checker, wherein,
   if the formal property checker finds a particular coverage item which, when selected, causes the selected property to fail, the evaluation tool determines that the selected property covers the particular coverage item, and
   if the formal property checker does not find any particular coverage item which, when selected, causes the selected property to fail, the evaluation tool determines that the selected property does not cover any coverage item of the plurality of coverage items.

21. The system of claim 20, wherein:
   if the evaluation tool determines that the selected property covers the particular coverage item, the evaluation tool outputs the particular coverage item and the property which was determined to cover the particular coverage item; and
   if the evaluation tool determines that the selected property does not cover any coverage item of the plurality of coverage items, the evaluation tool outputs the selected property and the plurality of not covered coverage items.

22. The system of claim 20, wherein:
   if the evaluation tool determines that the selected property covers the particular coverage item, the evaluation tool causes the particular coverage item to be removed from the plurality of individually selectable coverage items; and
   if the evaluation tool determines that the selected property does not cover any coverage item of the plurality of coverage items, the evaluation tool causes the selected property to be removed from the plurality of properties.

23. The system of claim 20, wherein the formal property checker uses an activation vector for determining whether selection of one particular coverage item of the plurality of coverage items causes the selected property to fail, wherein each component of the activation vector corresponds to one coverage item of the plurality of coverage items and one component of the activation vector has a value of 1 indicating a selected coverage item and all other components have zero values indicating unselected coverage items.

24. The system of claim 20, wherein the formal property checker is further configured to output at least a run-time information about a completed property check to the property selector for the purpose of prioritization of properties in subsequent checks.

25. The system of claim 20, wherein the property selector prioritizes properties whose previous checks took less time than previous checks of other properties of the plurality of properties when selecting the property of the plurality of properties.

\* \* \* \* \*